(12) United States Patent
Ebert et al.

(10) Patent No.: US 6,441,975 B1
(45) Date of Patent: Aug. 27, 2002

(54) DEVICE FOR THE LOW-DEFORMATION SUPPORT OF AN OPTICAL ELEMENT AND METHOD FOR THE LOW-DEFORMATION SUPPORT OF THE OPTICAL ELEMENT

(75) Inventors: Michael Ebert; Franz Sorg, both of Aalen; Michael Trunz, Pfahlheim; Frank Marianek, Oberkochen; Karlfried Osterried, Aalen; Markus Kasparek, Oberkirch, all of (DE)

(73) Assignee: Carl-Zeiss-Stiftung, Heindenheim (DE)

( * ) Notice: Subject to any disclaimer, the term of this patent is extended or adjusted under 35 U.S.C. 154(b) by 0 days.

(21) Appl. No.: 09/722,603

(22) Filed: Nov. 27, 2000

(30) Foreign Application Priority Data

Dec. 10, 1999 (DE) .......................................... 199 59 741

(51) Int. Cl.$^7$ ................................................ G02B 7/02
(52) U.S. Cl. ...................................... 359/819; 359/811
(58) Field of Search ............................... 359/810, 811, 359/819, 820, 822, 825, 828, 830; 353/100

(56) References Cited

U.S. PATENT DOCUMENTS 5,493,452 A * 2/1996 Hoshino et al. ............ 359/819
5,808,817 A * 9/1998 Miyamoto et al. .......... 359/819
6,307,688 B1 * 10/2001 Merz et al. ................. 359/819
6,381,081 B1 * 4/2002 Ford ........................... 359/819

FOREIGN PATENT DOCUMENTS

DE          41 13 956 C2      12/1993

* cited by examiner

Primary Examiner—Loha Ben
Assistant Examiner—Saeed Seyrafi
(74) Attorney, Agent, or Firm—Welsh & Katz, Ltd.

(57) ABSTRACT

A device for the low-deformation support of an optical element (2), in particular of an end plate of a lens in a projection printing system for semiconductor elements, is provided with a mount (1), the optical element (2) being connected to the mount (1) at least partly via a bonding layer which is located between the adjacent circumferential walls (4, 5) of mount (1) and optical element (2). The mount (1) is provided with at least three bearing feet (3) which are distributed over the circumference and on which the optical element (2) rests. The bonding layer is located in an annular gap (6) between the adjacent circumferential walls (4, 5) of mount (1) and optical element (2) over at least one section thereof.

10 Claims, 1 Drawing Sheet

DEVICE FOR THE LOW-DEFORMATION SUPPORT OF AN OPTICAL ELEMENT AND METHOD FOR THE LOW-DEFORMATION SUPPORT OF THE OPTICAL ELEMENT

The invention relates to a device for the low-deformation support of an optical element, in particular of an end plate of a lens in a projection printing system for semiconductor elements, according to the type defined in more detail in the preamble of claim 1. The invention also relates to a method for the low-deformation support of the optical element.

A device of the generic type is described in DE 41 13 956 C2. Accordingly, it is already known to provide a bonding layer solely in the circumferential region between an optical element and a mount surrounding it. Furthermore, the mount is provided with a groove which prevents adhesive from migrating beyond the actual adhesive contact surface, e.g. due to capillary actions. In addition to the adhesive bonding, which extends over the entire circumferential region, the optical element is held or clamped in place in the axial direction by a type of securing ring. The object of the previously known device is to produce a defined adhesive joint which can absorb the thermal differential expansions between mount and optical element.

Known end plates in lenses of a projection printing system have an L-shaped rotationally symmetrical bonding surface. Bonding cement is applied to this bonding surface. After the hardening, the bonding surface is turned out to form an L-shaped bonding cement bed, so that a uniform bearing surface is obtained. Bonding cement is again applied to this bearing surface and then the end plate is pressed in. The bonding cement finally hardens and the residues are removed.

However, a disadvantage with this bonding method known from practice is that distortion is induced in the end plate via moments due to the L-shaped bonding location. In addition, this manufacturing process involves considerable outlay, because, after the first application of a bonding layer, which is intended to ensure that there is equalization over the circumference, thus avoiding a situation in which the end plate still touches the metal of the mount somewhere or other, the bonding layer must then be left for a period until it has hardened, the device must be clamped in a tool, and the bearing surface must be turned out uniformly. only then is the actual bonding layer applied to the L-shaped bonding surface.

During the application of the bonding layer, it has now also been found that distortions varying with respect to time occur between the optical element, in particular an end plate of a lens for a projection printing system. In this case, the distortions vary during the hardening of the bonding layer, even when the end plate is cleaned.

The object of the present invention is to provide a device of the type mentioned at the beginning in which the optical element is at least largely free of deformations or can be supported in the mount while avoiding distortions, in particular to provide a support by means of which the distortions varying with respect to time are at least largely eliminated.

According to the invention, this object is achieved by the features mentioned in the defining part of claim 1. A method according to the invention for the low-deformation support is specified in claim 7.

According to the invention, freedom from distortions is at least largely achieved by adhesive bonding only at the lateral surface or the adjacent circumferential walls of mount and optical element. In order to prevent the optical element from being pushed through and in order to achieve more accurate positioning of the optical element, at least three bearing feet on which the plate rests directly are attached to the mount. Defined three-point bearing is achieved in this way.

Adhesive webs, by means of which the optical element is centered before the bonding layer is applied in the circumferential region, may advantageously be applied to the circumferential wall of the mount in the region of the bearing feet.

When, after the cement bed formed by the adhesive webs has hardened and been turned out, the bonding layer is subsequently placed over the entire circumferential region of the annular gap formed between the adjacent circumferential walls of mount and optical element, a seal is then also created at the same time between the mount and the optical element.

In a further, very advantageous refinement of the invention, provision may be made for the bearing feet to be provided with adhesive-receiving pockets.

The adhesive-receiving pockets form a gap, for which purpose they are preferably formed by radial recesses in the mount between the inner circumferential wall of the mount and the bearing feet. Adhesive from the adhesive webs can run into this gap. In this way, an escape space is provided for adhesive if too much adhesive is placed.

An exemplary embodiment of the invention is described below in principle with reference to the drawing, in which.

A mount 1, which in principle is of a known type of construction and can serve to support an optical element, e.g. an end plate 2 of a lens for projection printing systems for semiconductor components, is provided in the inner circumferential region with three bearing feet 3 arranged so as to be uniformly distributed over the circumference.

Figure 4:
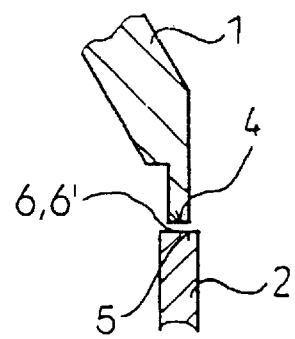
FIG. 4 shows a detail of a partial section through a mount and an optical element in a region without bearing feet.

The bearing feet 3 are in one piece with the mount 1 and project beyond the inner circumferential wall 4 of the mount 1. As can be seen from FIGS. 2 and 4, the mount 1 may have a cross-sectional reduction in the inner circumferential region. The diameters of the inner circumferential wall 4 of the mount 1 and of the circumferential wall 5 of the optical element, namely of the end plate 2, are mutually selected in such a way that an annular gap 6 remains in between.

Figure 1:
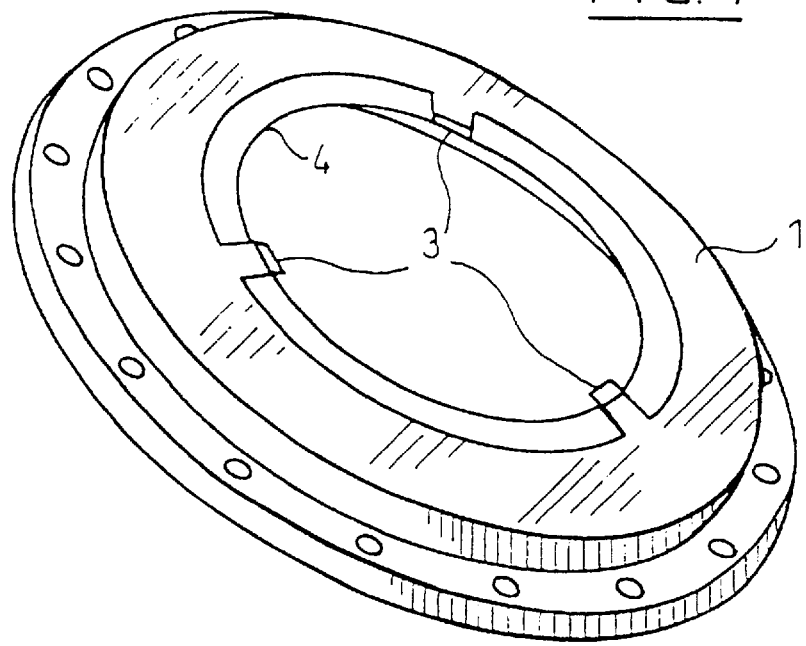
FIG. 1 shows a perspective representation of a mount according to the invention with bearing feet for an optical element.
Figure 2:
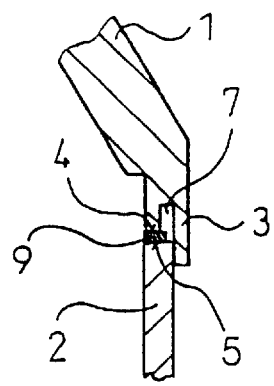
FIG. 2 shows a partial section in an enlarged representation through a mount and an end plate as an optical element in the region of the bearing feet.

It can be seen from FIG. 2 that the bearing feet 3 are provided with adhesive-receiving pockets 7. The adhesive-receiving pockets 7 are formed by the mount 1 being provided with a radial recess in its circumferential wall 4 in the region of the bearing feet 3.

Figure 3:
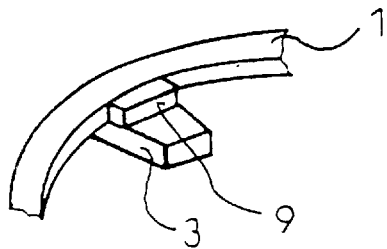
FIG. 3 shows a detail of a mount in the region of a bearing foot.

The end plate 2 is supported in the mount 1 in the following way:

In the region of the bearing feet 3, radial adhesive webs 9 are applied to the circumferential wall 4 of the mount 1 (see FIGS. 2 and 3). After the adhesive webs 9 have hardened, the three bonding cement beds formed in this way are turned out, so that a defined annular gap 6 is obtained. In the process, the three bearing feet 3 are turned metallically bright, the end plate resting on the bright feet. As a result, the end plate 2 is centered. The end plate 2 is therefore placed into the bonding cement bed produced in this way and is appropriately centered. A bonding cement layer 6' is then applied all the way round in the annular gap 6 between the circumferential wall 4 of the mount 1 and the circumferential wall 5 of the end plate 2, whereby a seal is then also made at the same time between the mount 1 and the end plate 2. The bearing feet 3 are used virtually only for the axial centering of the end plate 2. The actual connection between the mount 1 and the end plate 2 is effected at the circumference of the end plate 2 or its lateral surface by the bonding layer 6' in the annular gap 6.

The adhesive-receiving pockets 7 in the form of the gap in the mount 1 prevent the adhesive from flowing out unintentionally at any point due to capillary action when the adhesive webs 9 are applied to the bearing surfaces 4. In the ideal case, however, these pockets should be free of adhesive.

A defined bearing surface is created in the z-direction (contact metal/glass) by the bearing feet 3. Due to the support according to the invention, markedly reduced distortions of the end plate 2 are achieved in such a way that, due to a uniform annular gap 6, the stresses resulting from adhesive shrinkage produce a homogeneous stress distribution at the circumference. Owing to the fact that the adhesive bonding is located at the level of the neutral fibers of the end plate 2, moments on the end plate 2 due to adhesive shrinkage are avoided.

What is claimed is:

1. A device for the low deformation support of an optical element, having a mount with an annular gap, the optical element being connected to the mount by a bonding layer comprising an adhesive extending over the entire circumference of said annular gap wherein the mount is provided with at least three bearing feet about the circumference, each bearing foot having a hardened web on which the optical element rests, the bonding layer being located in said annular gap between the adjacent circumferential walls of the mount and the optical element.

2. The device as claimed in claim 1, wherein the adhesive webs (9) are arranged in the region of the neutral fibers of the optical element (2).

3. The device as claimed in claim 1, wherein the bearing feet are provided with adhesive receiving pockets.

4. The device as claimed in claim 3, wherein the bearing feet are formed in one piece with the mount, and wherein the adhesive receiving pockets are formed by radial recesses in the mount.

5. The device of claim 1 wherein the optical element is an end plate of a lens in a projection system of the manufacturing of semiconductor elements.

6. A method for the low deformation support of an optical element, having a projection printing system for semiconductor elements, in a mount, a bonding layer being at least partly placed in between the adjacent circumferential walls of mount and optical element, comprising the steps of forming the bearing feet in one piece with the mount and wherein, after applying adhesive webs to the circumferential wall of the mount in the region of the bearing feet placing, the optical element on at least three bearing feet and centering the optical element via the adhesive webs, and wherein, after centering the optical element has been centered, applying a bonding layer over the circumference of the annular gap between the mount and optical element and forming a seal between the mount and the optical element.

7. The method as claimed in claim 6, wherein the adhesive webs are applied to the circumferential wall of the mount in the region of the neutral fibers of the optical element.

8. A device for the low deformation support of an optical element in a lens, connected to the mount by a bonding layer comprising an adhesive extending over the entire circumference of said annular gap wherein the mount is provided with at least three bearing feet about the circumference, each bearing feet having a hardened web on which the optical element rests, the bonding layer being located in said annular gap between the adjacent circumferential walls of the mount and the optical element.

9. The method of claim 8 wherein the optical element is an end plate of a lens in a projection system of the manufacturing of semiconductor elements.

10. A method for the low deformation support of an optical element, for the manufacture of semiconductor elements in a mount, comprising placing a bonding layer at least partly in between adjacent circumferential walls of the mount and the optical element, forming the bearing feet in one piece with the mount, and, after applying adhesive webs to the circumferential wall of the mount in the region of the bearing feet, placing the optical element on at least three bearing feet and centering the optical web by the adhesive webs, and, applying a bonding layer over the entire circumference of the annular gap between mount and optical element thereby forming a seal between the mount and the optical element.

* * * * *

UNITED STATES PATENT AND TRADEMARK OFFICE
CERTIFICATE OF CORRECTION

PATENT NO. : 6,441,975 B1
DATED : August 27, 2002
INVENTOR(S) : Ebert et al.

It is certified that error appears in the above-identified patent and that said Letters Patent is hereby corrected as shown below:

<u>Title page,</u>
Item [73], Assignee: "Carl-Zeiss-Stiftung, Heindenheim" should be -- Carl-Zeiss-Stiftung trading as Carl Zeiss, Heidenheim --;

<u>Column 1,</u>
Line 44, "uniformly. only" should be -- uniformly. Only --;
Line 63, "in claim 7" should be -- in claim 6 --;

<u>Column 3,</u>
Line 40, "adhesive webs (9)" should be -- adhesive webs --;
Line 41, "the optical element (2)" should be -- the optical element --.

Signed and Sealed this

Seventh Day of January, 2003

JAMES E. ROGAN
*Director of the United States Patent and Trademark Office*